United States Patent
Rahimo et al.

(10) Patent No.: US 11,522,047 B2
(45) Date of Patent: Dec. 6, 2022

(54) NON-PUNCH-THROUGH REVERSE-CONDUCTING POWER SEMICONDUCTOR DEVICE AND METHOD FOR PRODUCING SAME

(71) Applicant: mqSemi AG, Zug (CH)

(72) Inventors: Munaf Rahimo, Gaensbrunnen (CH); Iulian Nistor, Niederweningen (CH)

(73) Assignee: MQSEMI AG, Zug (CH)

( * ) Notice: Subject to any disclaimer, the term of this patent is extended or adjusted under 35 U.S.C. 154(b) by 114 days.

(21) Appl. No.: 16/897,921

(22) Filed: Jun. 10, 2020

(65) Prior Publication Data

US 2020/0395442 A1 Dec. 17, 2020

(51) Int. Cl.
*H01L 29/06* (2006.01)
*H01L 29/66* (2006.01)
*H01L 29/739* (2006.01)

(52) U.S. Cl.
CPC .... *H01L 29/0696* (2013.01); *H01L 29/66333* (2013.01); *H01L 29/7397* (2013.01)

(58) Field of Classification Search
CPC ........... H01L 29/0696; H01L 29/66333; H01L 29/7397; H01L 29/0834; H01L 29/66348; H01L 29/7395; H01L 29/1004; H01L 29/7393
USPC ....................................................... 257/330
See application file for complete search history.

(56) References Cited

U.S. PATENT DOCUMENTS

| | | | |
|---|---|---|---|
| 6,610,572 B1 * | 8/2003 | Takei | H01L 29/66348 257/E29.198 |
| 8,212,283 B2 | 7/2012 | Storasta et al. | |
| 2005/0017290 A1 | 1/2005 | Takahashi et al. | |
| 2011/0254050 A1 * | 10/2011 | Udrea | H01L 29/0834 257/140 |

FOREIGN PATENT DOCUMENTS

WO    WO-0007245 A1 *    2/2000    ............. H01L 29/32

OTHER PUBLICATIONS

T. Laska et al., "Optimizing the Vertical IGBT Structure—The NPT Concept as the Most Economic and Electrically Ideal Solution for a 1200V-IGBT", 8th ISPSD 1996.

(Continued)

*Primary Examiner* — Mohammad M Hoque
(74) *Attorney, Agent, or Firm* — Tarolli, Sundheim, Covell & Tummino LLP

(57) ABSTRACT

A thin non-punch-through semiconductor device with a patterned collector layer on the collector side is proposed. The thin NPT RC-IGBT semiconductor device has a collector layer with a pattern of p/n shorts, an emitter side structured as a functional MOS cell, a base layer arranged between the emitter and the collector sides, but without the use of a buffer/field-stop layer. A low doped bipolar gain control layer having a thickness of less than 10 μm may be used in combination with a short pattern of the collector to reduce the bipolar gain and achieve thinner devices with lower losses and high operating temperature capability. The doping concentration of the base layer and a thickness of the base layer are adapted such that the distance from the end of the electric field region to the patterned collector, at breakdown voltage, is less than 15% of the total device thickness.

11 Claims, 14 Drawing Sheets

(56) References Cited

OTHER PUBLICATIONS

H. Akiyama et al., "Effect of a shorted collector on characteristics of IGBTs" 2nd ISPSD, 1990.
H. Dettmer et al., "Punch-through IGBTs with homogeneous n-base operating at 4 kV line voltage" ISPSD 1995.

* cited by examiner

-- PRIOR ART --

-- PRIOR ART --

-- PRIOR ART --

-- PRIOR ART --

NON-PUNCH-THROUGH REVERSE-CONDUCTING POWER SEMICONDUCTOR DEVICE AND METHOD FOR PRODUCING SAME

CROSS-REFERENCE TO RELATED APPLICATIONS

The present application claims priority to GB Patent Application No. 1908360.7 filed on 12 Jun. 2019. The entirety of this application is hereby incorporated by reference for all purposes.

FIELD OF THE INVENTION

The invention relates to the field of power electronics and more particularly to a non-punch-through reverse-conducting semiconductor device with significantly reduced thickness compared to prior art semiconductor devices, and to a method for producing such non-punch-through semiconductor device.

BACKGROUND

Power electronics applications such as in grid systems, renewables, industrial drives and automotive, require high power semiconductor devices with low losses and high efficiency. One development trend to achieve this target is the reduction of the total device thickness. Typically, in power semiconductor devices that include a pn-junction, substrates having a thickness being larger than the maximum thickness of a depletion layer in reverse operation are used. Thus, even at maximum reverse voltage, i.e. slightly below a breakdown voltage of the device, the depletion layer and the electrical field prevailing therein do not reach to a collector of the device. Such devices are also referred to as non-punch-through devices (NPT).

In the ISPSD 1996 paper *Optimizing the Vertical IGBT Structure—The NPT Concept as the Most Economic and Electrically Ideal Solution for a* 1200V-IGBT by T. Laska et. al., a typical non-punch-through (NPT) insulated gate bipolar transistor (IGBT) is described. A cross section of such an NPT-IGBT 10 is schematically shown in FIG. 1 and a representation of the corresponding doping concentration profile and electrical field at breakdown voltage $V_{bd}$ is schematically shown in FIG. 2.

For devices rated below 2000V with final device thicknesses below 300 µm, the device may be produced by using an n-doped wafer having a homogeneous doping concentration for forming a base layer 4. On top of the wafer all processes for manufacturing layers on an emitter side 31, also called cathode side, are performed, i.e. active area, junction termination and metallization on the emitter side are produced. Afterwards, the wafer is thinned to the desired thickness leaving a "safe distance" or "space charge free (SCF) zone" of typically above 15% or more typically above 20% of the total device thickness between the electric field (or space charge region) edge 50 and the collector side 21 also called anode side of the wafer at break down voltage $V_{bd}$ of the semiconductor, since the semiconductor device can be destroyed if the electric field reaches the collector layer 6. The collector side is opposite to the emitter side. Then p-type particles are implanted on the collector side of the wafer for forming a collector layer. The wafer is then annealed at 400° C. to 500° C. in order to activate the p-type particles without damage to the structure on the emitter side.

However, it has been observed that electrical losses in electronic power devices strongly depend upon the thickness of the device. Accordingly, devices with reduced thickness have been developed as punch-through semiconductors by using an additional buffer or field-stop layer 5. In U.S. Pat. No. 6,762,080 B2 a punch-through (PT) insulated gate bipolar transistor (IGBT) is described. Alongside the NPT-IGBT, a cross section of such a PT-IGBT 20 is schematically shown in FIG. 1 and a representation of the corresponding doping concentration profile and electrical field at $V_{bd}$ is schematically shown in FIG. 2 while depicting the potential thickness reduction achieved with PT structure compared to a NPT structure. The PT device may be produced in a similar way to the NPT method described above but the wafer further includes a highly doped n-type buffer layer 5 formed on the collector side 21 opposite to the emitter side 31. The buffer layer 5 for devices rated below 2000V can be formed before or after thinning the device by means of implantation and/or deep diffusions, proton irradiation and low temperature anneal below 450° C., or high energy phosphorus implantation and laser anneal to mention a few methods. In principle, due to the continuously rising doping concentration in the buffer layer 5 towards the collector side, the reduction of the electric field during operation of the device increases within the buffer layer 5. Thus, the buffer layer 5 serves mainly, in the blocking case, for decelerating and stopping the electric field (shown in FIG. 2 by the dotted line) before reaching the collector and thus keeping it away from said collector. Such devices with n-buffer layers may show reduced electrical losses due to the effect of the thickness reduction and low leakage current at higher temperatures due to the low pnp bipolar gain. However, they may not always provide satisfying electrical characteristics with respect to turn-off softness and short circuit performance. Typically, the buffer layer has a thickness in the range of 3 µm to 30 µm with many concept variants found in prior-art. Furthermore, introducing the n-type buffer layer 5 is a complicated process for implementing with thin wafer devices due to necessary deep diffusions and/or defect introduction and activation.

Thus, NPT devices are much more economic to produce compared to punch-through devices and have other inherent benefits such as softness and higher short circuit ruggedness. However, with conventional design rules, the NPT devices are severely limited by the thickness of the base layer. In order to reduce the losses, reducing the thickness of the base layer by just conventional means leads to significant deterioration of device blocking performance due to the increase in the pnp bipolar gain amplification factor. Therefore, as a typical example, all commercially available NPT-IGBTs rated at 1200V are currently designed with a typical wafer thickness around 180 um compared to a thickness of about 130 µm for punch-through type devices. In addition, such NPT devices are also limited in operation to a maximum junction temperature of 125 C.

In the ISPSD 1990 paper *Effect of a shorted collector on characteristics of IGBTs* by H. Akiyama et. al., a NPT-IGBT 100 with collector shorts (CS) or NPT CS-IGBT is described while in the ISPSD 1995 paper *Punch-through IGBTs with homogeneous n-base operating at 4 kV line voltage* by H. Dettmer et. al., a PT IGBT 200 with collector shorts (CS) is described or PT CS-IGBT. The cross sections of both devices are schematically shown in FIG. 3 and a representation of the corresponding doping concentration profile and electrical field at $V_{bd}$ is schematically shown in FIG. 4 while depicting the potential thickness reduction achieved with PT CS-IGBT compared to a NPT CS-IGBT structure. The basic device structures may be produced in a similar way to the NPT and PT methods described above but the wafer further includes a very highly doped n-type short layer 8 formed on the collector side 21 opposite to the emitter side 31. The n-type shorts are typically introduced for devices rated below 2000V after device thinning with a standard photolithography masking process of the n-type short layer 8 implantation on the collector side 21 and subsequent activation at low temperatures below 500° C. or laser anneal.

The collector shorting provides another method to control the collector injection efficiency in power devices. However, for an IGBT, a collector short also introduces a reverse conducting path which is undesirable when an IGBT is utilized with an external free-wheeling diode in most applications. The device characteristics can be altered depending on the p-type collector 6 and n-type short 8 dimensions and area ratios.

However, by adjusting the collector short design and IGBT design, a fully functional Reverse Conducting (RC) IGBT can be realized by eliminating the need for an external anti-parallel free-wheeling fast diode. In the US patent application US2005/0017290 a non-punch-through NPT RC-IGBT 100 is described, which comprises within one wafer an insulated gate bipolar transistor with a built-in freewheeling diode. A punch-through PT RC-IGBT 200 can also be realised as described in U.S. Pat. No. 8,212,283B2. The PT RC-IGBT shows typically strong on-state IV snap-back behaviour due to the high buffer doping concentration. The snap-back phenomenon is highly undesirable and can lead to unstable current sharing between parallel devices during switching. Therefore, improved short layout designs are needed for PT RC-IGBTs to lower or eliminate the snap-back phenomenon as described in U.S. Pat. No. 8,212, 283B2.

Due to the absence of a buffer layer in an NPT RC-IGBT, the device exhibits lower diode snap-back behavior. This advantage comes at the expense of increased static and dynamic losses due to the increased device thickness. In addition, due to the absence of an n-type buffer to limit the higher bipolar gain as described previously, NPT devices have to be operated at lower junction temperatures, which increases the challenge of cooling of the power electronic systems.

BRIEF DESCRIPTION

The embodiments of the invention will be explained in more detail in the following text with reference to the attached exemplary drawings, in which.

Figure 8:
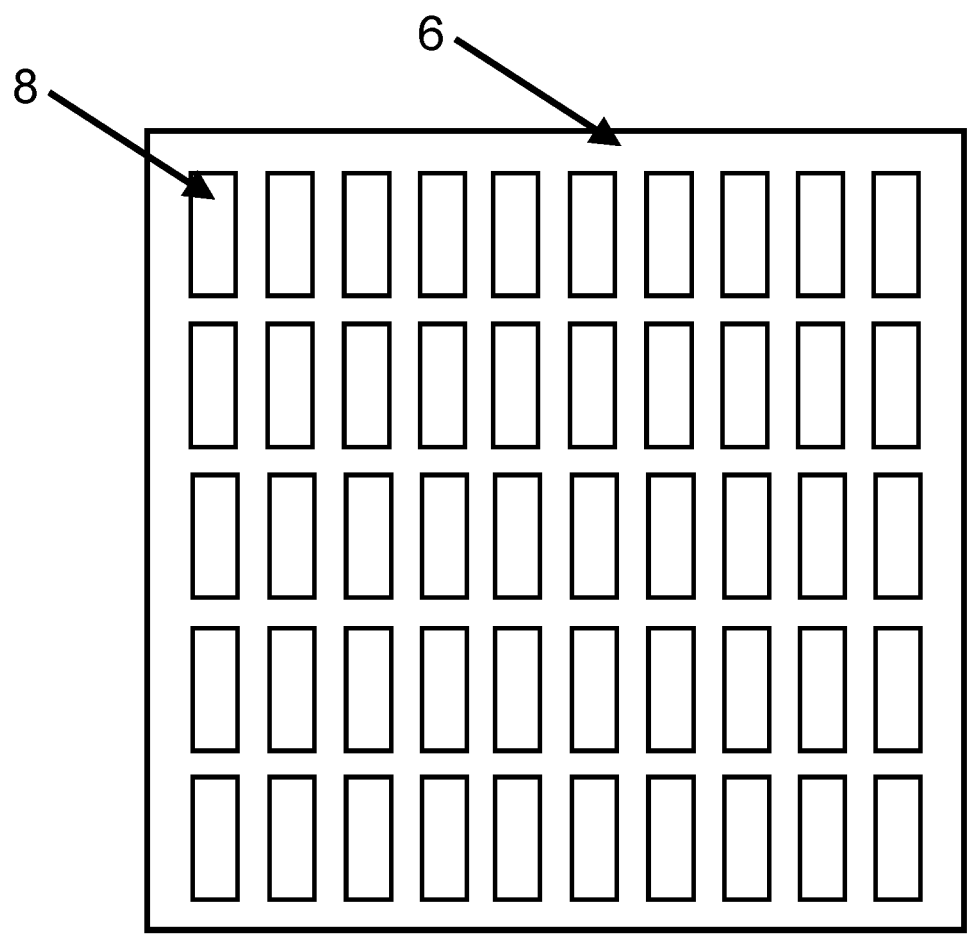
Figure 9:
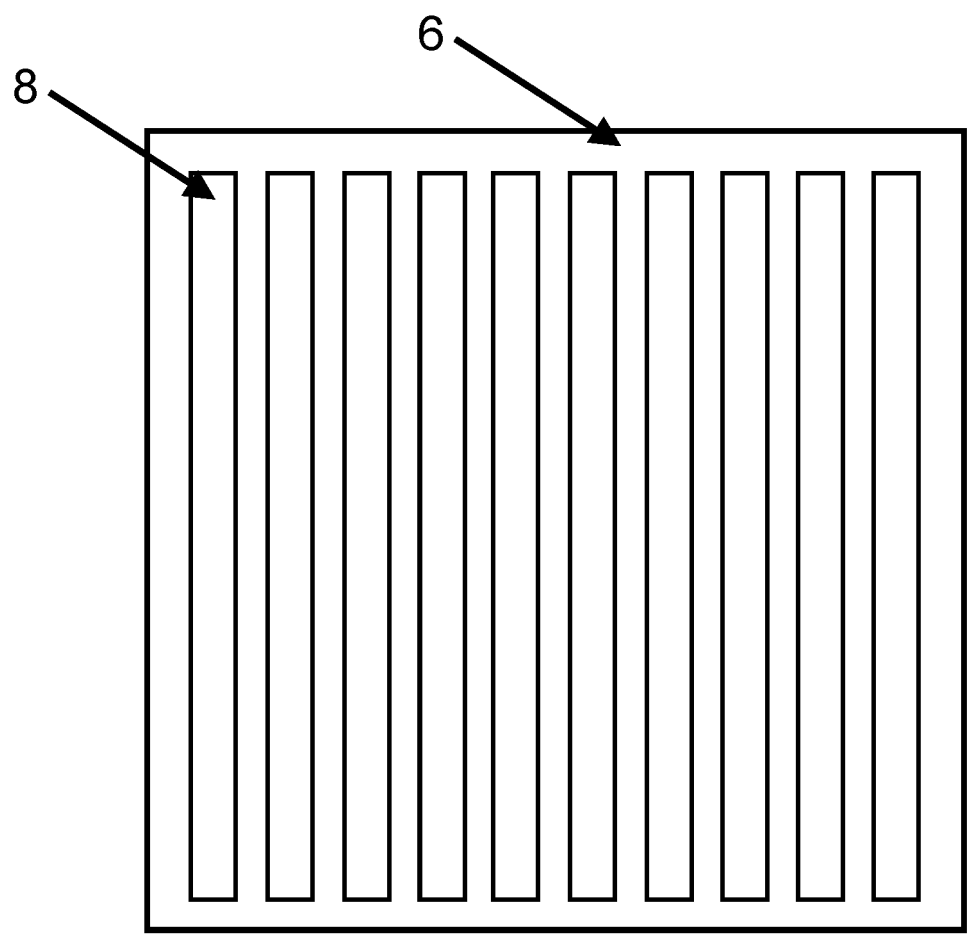
Figure 10:
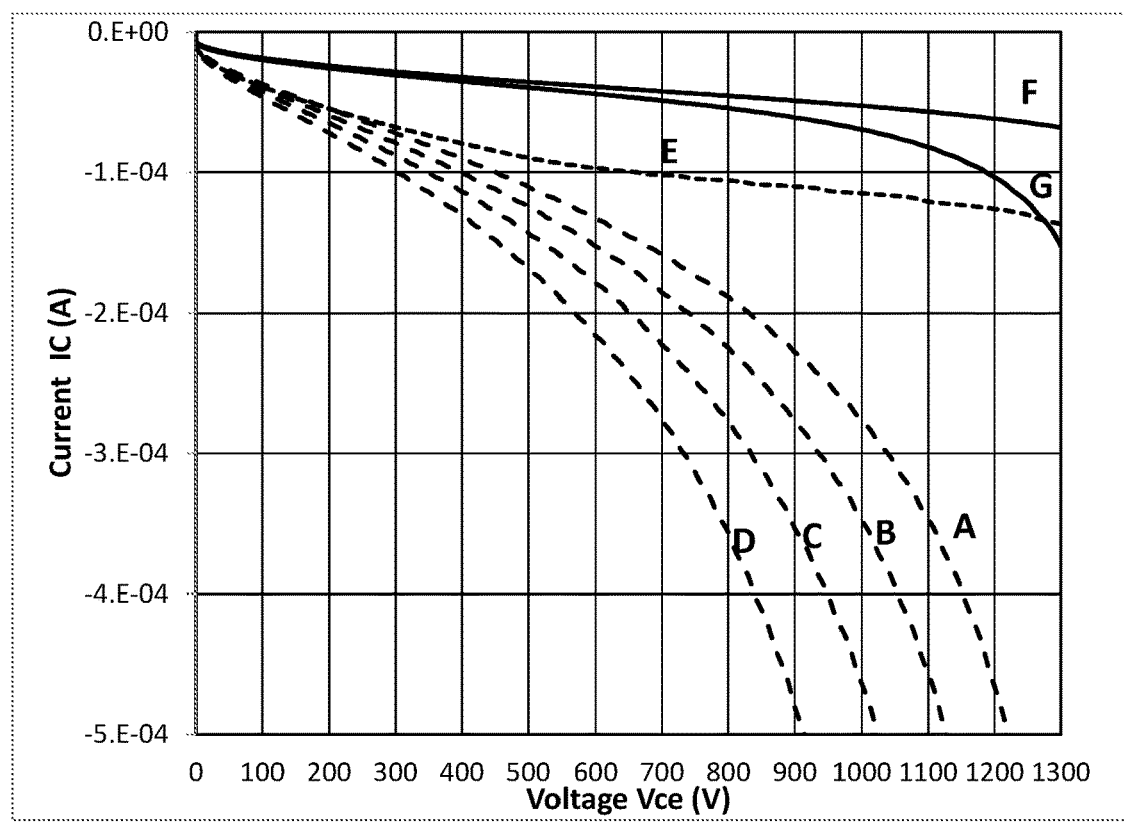

FIG. 8: shows a plan view of the structures of first and second regions on the collector side of another reverse-conducting IGBT according to the invention;

FIG. 9: shows a plan view of the structures of first and second regions on the collector side of another reverse-conducting IGBT according to the invention;

FIG. 10: shows a graph representing the blocking characteristics for the collector leakage current versus the collector emitter voltage at 125° C. of the non-punch-through NPT IGBT and NPT RC-IGBT, and punch-through PT-IGBT in comparison to the thin non-punch-through NPT RC-IGBT according to embodiments of the invention.

Figure 11:
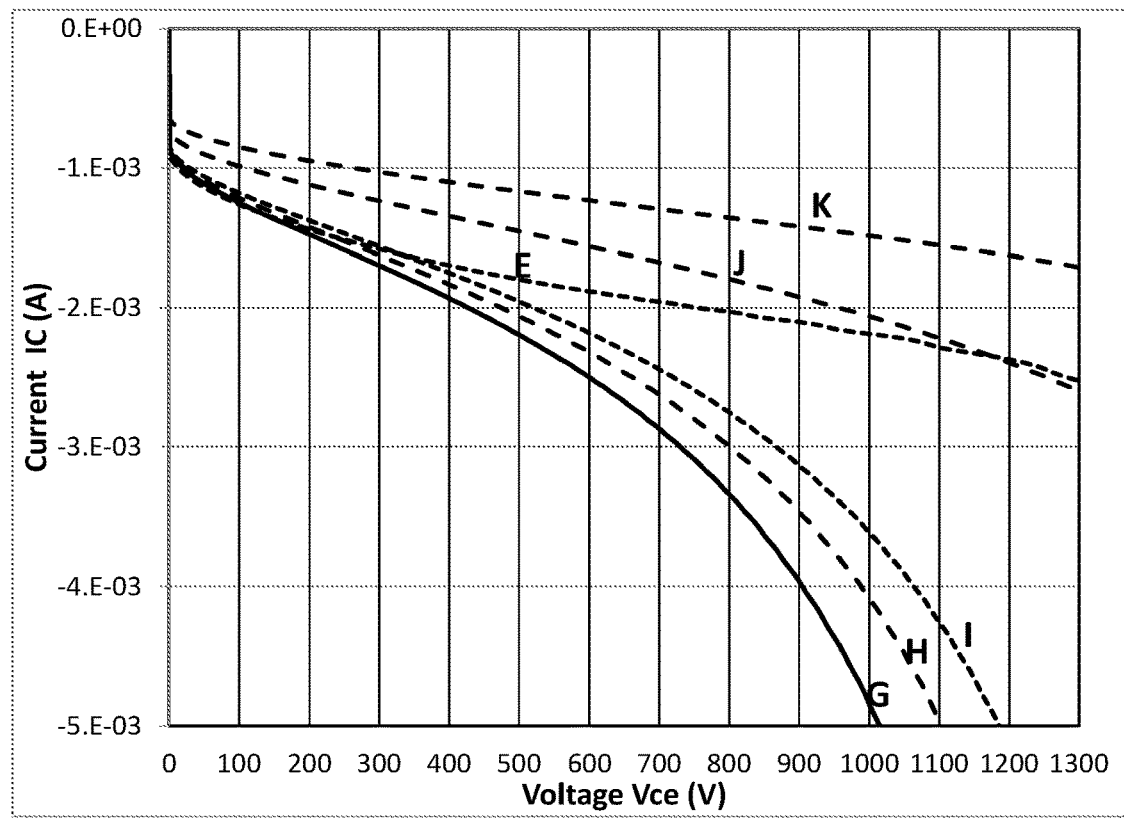

FIG. 11: shows a graph representing the blocking characteristics for the collector leakage current versus the collector emitter voltage at 200° C. of the thin non-punch-through NPT RC-IGBT according to embodiments of the invention with different BGC layer peak doping concentrations, in comparison to a conventional/prior art PT-IGBT.

Figure 12:
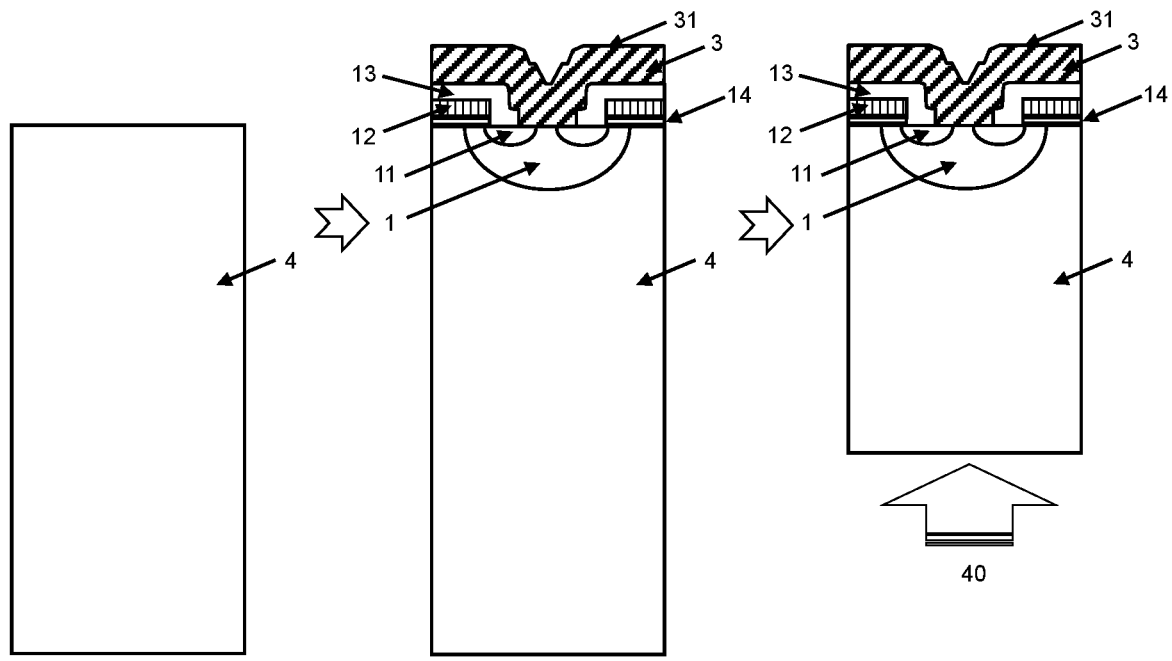
Figure 13:
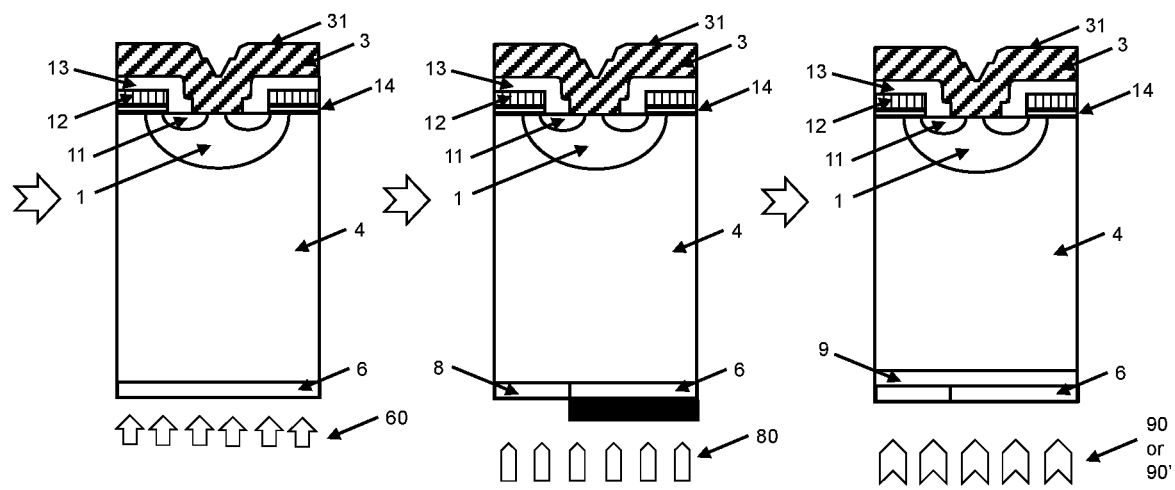
Figure 14:
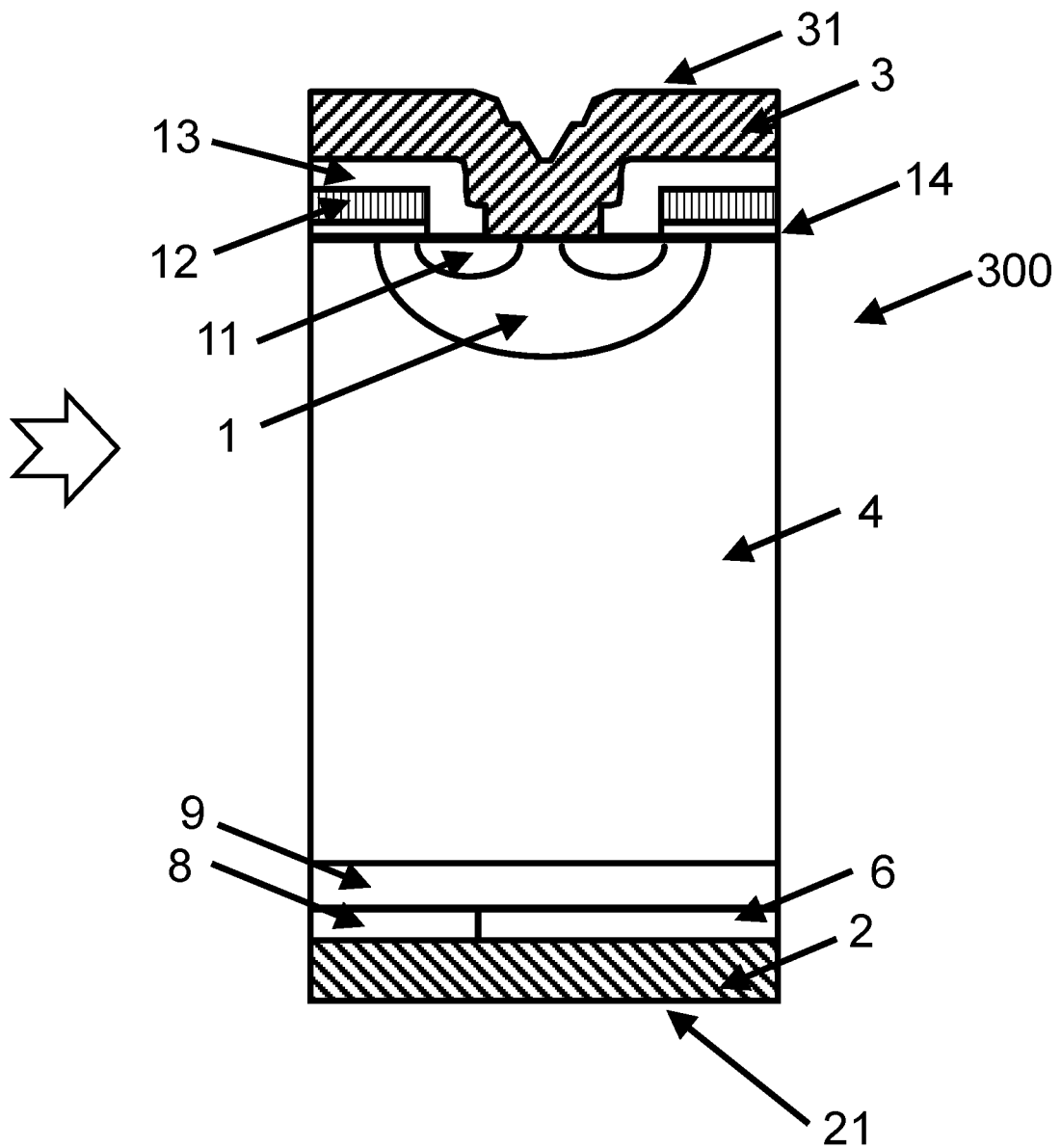

FIGS. 12-14: show the different manufacturing steps of a thin NPT reverse-conducting IGBT according to the invention.

Figure 15:
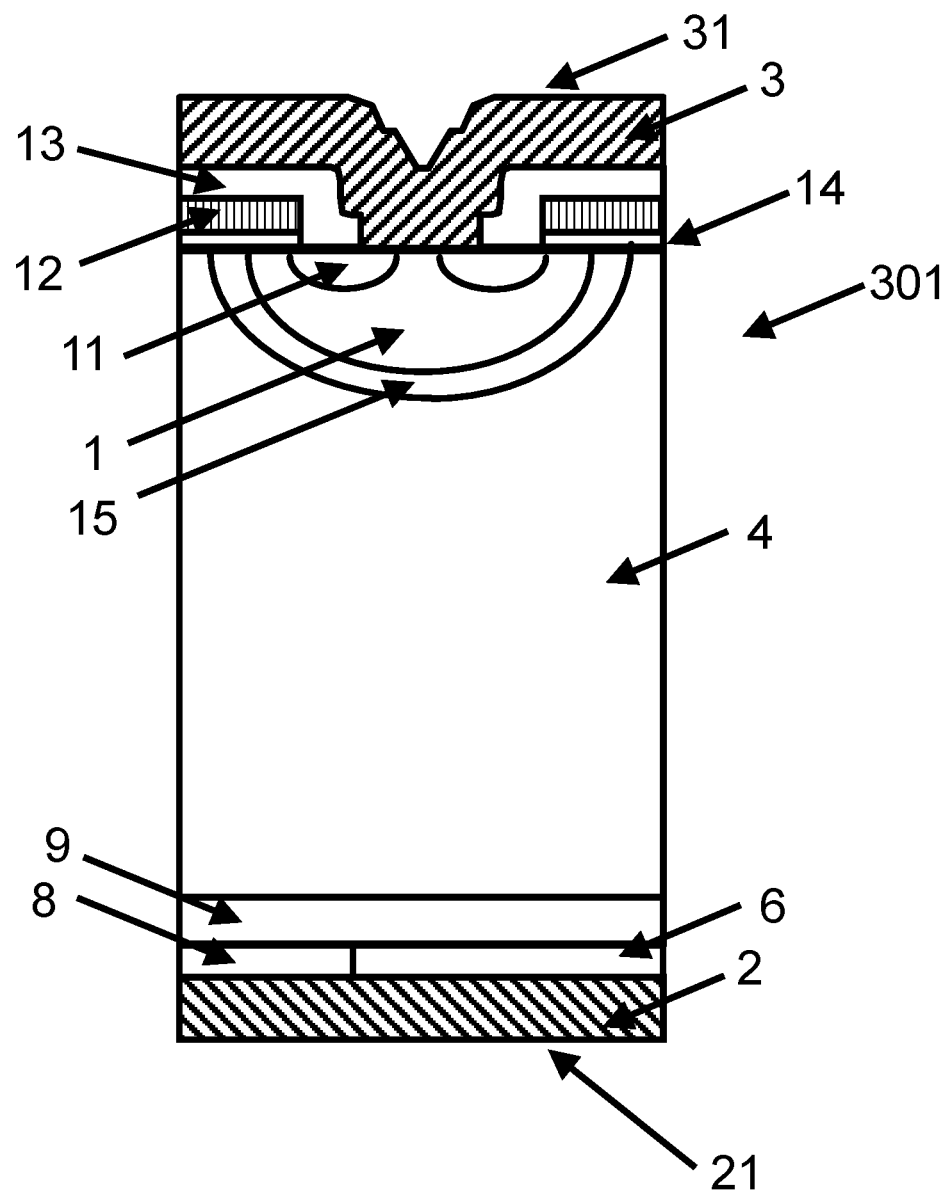

FIG. 15: shows the cross section of another inventive reverse-conducting IGBT with an enhancement layer according to the invention.

Figure 16:
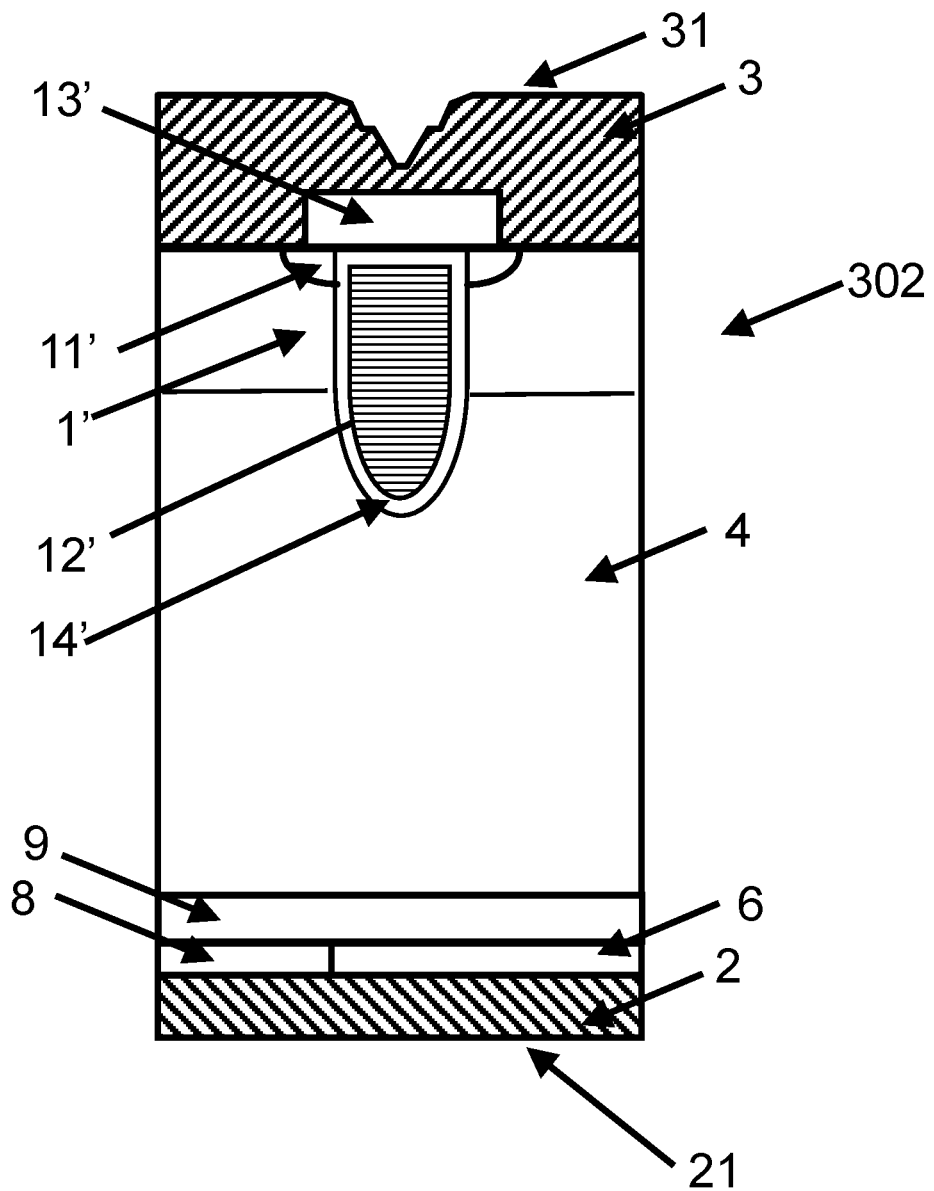

FIG. 16: shows the cross section of another inventive reverse-conducting IGBT with trench gate electrodes according to the invention.

DETAILED DESCRIPTION

It may be an object of the present invention to provide a thin non-punch-through reverse conducting Insulated gate bipolar transistor NPT RC-IGBT with improved electrical characteristics. Furthermore, it may be an object of the present invention to provide a method for producing such non-punch-through reverse conducting semiconductor device.

These objects may be met by the subject matter of the independent claims. Embodiments of the invention are described with respect to the dependent claims.

Aspects of the present invention have been developed based on the following findings: in conventional NPT semiconductor devices such as for example NPT insulated gate bipolar transistors NPT-IGBT, a safe distance "space charge free zone (scfz)" of more than 15% of the total device thickness is conventionally implemented to support the separation of the end electric field (or space charge) region and collector side up to the break down voltage $V_{bd}$. For example, the breakdown voltage $V_{bd}$ of an NPT-IGBT with a voltage rating $V_{rating}$ of 1200 V having a thickness of 180 μm may be 1300 V. The implemented safe distance is adjusted to be more than 30 μm in this case by controlling the n-type base resistivity to have a value around 50 ohm·cm, which corresponds to a doping concentration of $8.6e13/cm^3$. Conventionally, a thickness below 170 µm for a 1200V rated NPT-IGBT has not been realized up to now.

The "breakdown voltage" $V_{bd}$ may be defined as the voltage at which a specific semiconductor device breaks down due for example to avalanche effects.

An idea of the present invention may be to provide a new design rule for non-punch-through semiconductor devices, particularly for reverse conducting RC-IGBTs, while at the same time improving the electrical performance of the conventional NPT-IGBTs. The new design rule may be particularly advantageous for application on power semiconductor devices rated below 2000 V as such relatively low rated power semiconductor devices typically comprise thin semiconductor wafers and can benefit more from an NPT structure compared to higher voltage rated devices.

According to an aspect of the present invention, a non-punch-through reverse conducting semiconductor device comprising a four-layer structure with reduced thickness is proposed, wherein the four-layer structure comprises: (1) a collector on a collector side of the semiconductor device including an optimized pattern of alternating p-type doped and n-type doped regions; (2) an emitter on an emitter side, which lies opposite to the collector side; (3) a base layer arranged between the emitter and the collector; and (4) a low doped bipolar gain control (BGC) layer arranged between the base layer and the collector. Therein, the base layer preferably may have a substantially constant doping concentration, meaning that the doping concentration is substantially homogeneous throughout the base layer. The low doped bipolar gain control (BGC) layer has a peak doping concentration which is equal or higher than the doping concentration of the base layer.

As special features, (1) the doping concentration of the base layer and a thickness of the base layer are selected such that at the breakdown voltage $V_{bd}$ of the semiconductor device, the length of the "space charge free (SCF) zone" (i.e. the distance from the end of the electric field (or space charge) region to the collector side) is reduced to below 15% of the total device thickness, and (2) the electric field (or space charge) region does not reach the low doped bipolar gain control (BGC) layer which is entirely located in the "space charge free (SCF) zone".

The thickness of the space charge region at a specific reverse voltage and the breakdown voltage of the semiconductor device strongly depend upon a doping concentration within the base layer of the device. The proposed new design rule includes a selection range on the thickness of the base layer for a non-punch-through semiconductor device depending on the doping concentration of the base layer.

The proposed new design is specifically applicable for power semiconductor devices such as IGBTs and in particular RC-IGBTs processed on thin wafers rated below 2000 V with target thicknesses much lower than showed possible in the paper *Optimizing the Vertical IGBT Structure—The NPT Concept as the Most Economic and Electrically Ideal Solution for a 1200V-IGBT* by T. Laska et. al.

For example, the new design may be applied to a 1200 V RC-IGBT and may result in a non-punch-through device thickness below 160 µm compared to the state-of-the-art 170 µm to 180 µm. This means that an NPT RC-IGBT can achieve comparable or even better performance than punch-through IGBTs, at lower manufacturing costs and complexity. The proposed design rule may allow the device to maintain similar losses as prevailing in conventional punch through designs with a higher or similar blocking capability. The new design rule may also benefit from softer turn-off characteristics, and higher temperature of operation due to the severe limitations in leakage current for conventional NPT-IGBT which lead to the thermal runaway of the semiconductor device.

To allow for thickness reductions for an NPT device with an n-type base layer, a reduction of the pnp bipolar gain is necessary. This is achieved with a combination of (1) a shorted collector pattern of alternating p-type doped and n-type doped regions and (2) a low n-type doped bipolar gain control BGC layer located in its entirety in the SCF zone. The BGC layer main task is to provide a lower bipolar gain for a reduced leakage current in the reverse blocking state and stable reverse blocking characteristics statically and dynamically.

The peak doping concentration of the BGC layer may be below $1 \times 10^{16}$ cm$^{-3}$, preferably below $5 \times 10^{15}$ cm$^{-3}$ and more preferably below $1 \times 10^{15}$ cm$^{-3}$. Accordingly, the peak doping concentration of the BGC layer may be lower than in conventional punch-through semiconductor devices since it is not required to perform as a buffer layer or field stop layer. The low doped BGC layer will provide good on-state IV performance with minimum snap-back for improved current sharing between parallel devices during switching.

The BGC layer may have a thickness ranging between 1 µm and 10 µm, preferably between 1 µm and 5 µm and more preferably between 1 µm and 3 µm. As the thickness of the BGC layer according to the invention may be significantly thinner than in conventional punch through semiconductor devices, it may be easier to be produced using for example ion implantation or proton irradiation defect engineering techniques.

Advantageously, the doping concentration of the base layer, and a thickness of the base layer are adapted such that the space charge free (SCF) zone at $V_{bd}$ is smaller than 15%, preferably smaller than 10%, and more preferably smaller than 5%.

Advantageously, the proposed new design may be applied to semiconductor devices in which the doping concentration of the base layer, and a thickness of the base layer are adapted such that the breakdown voltage $V_{bd}$ of the semiconductor device is below 2500 V, preferably below 2200 V and more preferably below 2000 V. As the rated voltage $V_{rating}$ of a semiconductor device is usually defined as being sufficiently below the breakdown voltage of the device, this may correspond to the semiconductor device having a rated voltage being for example smaller than 1800 V. As already indicated above, the proposed new design may be specifically suitable for such relatively low rated semiconductor devices. A reason may lie in the fact that for such devices, the use of a buffer or field-stop layer for thin wafers is very complicated from the processing perspective, and affects device performance parameters such as ruggedness and softness. Furthermore, applying the new design rule for higher voltage devices may not lead to substantial advantages due to the much lower base region doping concentrations employed for such devices.

According to a further aspect of the present invention, a method for producing a thin non-punch-through reverse conducting Insulated gate bipolar transistor NPT RC-IGBT comprising a four-layer structure with layers of different conductivity types is proposed. The method comprises production steps being preferably performed in the following order: (a) providing a wafer of a first conductivity type, which comprises a first side which is the emitter side in the finalized semiconductor device, and a second side lying opposite the first side; (b) performing steps for producing an emitter layer on the first side; (c) thinning down the wafer by mechanical grinding and/or etching to reduce its thickness to the desired value, as indicated by the target breakdown voltage of the device; and (d) applying particles of a first and second conductivity type to the wafer on its second side by implantation or deposition, which particles form a pattern of alternate p-type doped and n-type doped regions on the collector layer to form a shorted collector in the finalized reverse conducting semiconductor device; and (e) applying particles or donor defects by using implantation or proton irradiation and subsequent annealing to form a bipolar gain control layer of the first conductivity type located in the space charge free zone.

Accordingly, when the method is adapted for producing an RC-IGBT, in step (d), p-type particles such as Boron (B) may be implanted uniformly with a dose higher than $1\times10^{12}$ cm$^{-2}$, preferably higher than $5\times10^{12}$ cm$^{-2}$, and more preferably above $1\times10^{13}$ cm$^{-2}$ and with energies higher than 10 keV, preferably higher than 25 keV, and more preferably above 50 keV. Accordingly, n-type particles such as Phosphorus (P) may be implanted with a predefined pattern with a dose higher than $1\times10^{14}$ cm$^{-2}$, preferably higher than $5\times10^{14}$ cm$^{-2}$, and more preferably above $1\times10^{15}$ cm$^{-2}$ and with energies higher than 50 keV, preferably higher than 100 keV, and more preferably higher than 120 keV to ensure full compensation of the p-type regions and a suitable pattern of alternate p-type doped and n-type doped regions will be created on the collector side. The predefined pattern can be of different layout design concepts such as cellular, short or long stripes and/or other variations. The dimension of the p-type doped regions is more than 50 um, preferably above 100 um, and more preferably above 200 um. The dimension of the n-type doped regions is 10 um, preferably above 50 um, and more preferably above 100 um. The dimension of the p-type doped region is equal or larger than the dimension of the n-type doped region. After step (d), an annealing step may be performed, wherein the annealing step comprises thermal annealing at temperatures below 500° C., preferably below 450° C. Alternatively, the annealing step may be performed by a laser annealing to achieve higher dopant activation levels.

Accordingly, when the method is adapted for producing the BGC layer for the RC-IGBT, in step (e), n-type particles such as Phosphorus (P) may be implanted uniformly with a dose lower than $5\times10^{12}$ cm$^{-2}$, preferably lower than $1\times10^{12}$ cm$^{-2}$, and more preferably lower than $5\times10^{11}$ cm$^{-2}$ and with energies higher than 100 keV, preferably higher than 150 keV, and more preferably above 200 keV. After step (e), an annealing step may be performed, wherein the annealing step comprises thermal annealing at temperatures below 500° C. Alternatively, the annealing step may be performed by a laser annealing to achieve higher dopant activation levels. The activation can be done at the same step as for step (d) or separately.

Alternatively, when the method is adapted for producing the BGC layer for the RC-IGBT, in step (e), particles such as Hydrogen (H) (i.e. proton) may be implanted or irradiated uniformly with a dose lower than $1\times10^{15}$ cm$^{-2}$, preferably lower than $1\times10^{14}$ cm$^{-2}$, and more preferably lower than $5\times10^{13}$ cm$^{-2}$ and with energies higher than 100 keV, preferably higher than 200 keV, and more preferably above 300 keV. After step (e), an annealing step may be performed, wherein the annealing step comprises thermal annealing at temperatures below 450° C. The activation can be done after step (d) is completed if laser anneal is performed for step (d).

It has to be noted that aspects and embodiments of the present invention are described herein with reference to different subject-matters. In particular, some embodiments are described with reference to the method type claims whereas other embodiments are described with reference to apparatus type claims. However, a person skilled in the art will gather from the above and the following description that, unless other notified, in addition to any combination of features belonging to one type of subject-matter also any combination between features relating to different subject-matters, in particular between features of the apparatus type claims and features of the method type claims, is considered to be disclosed with this application.

Figure 1:
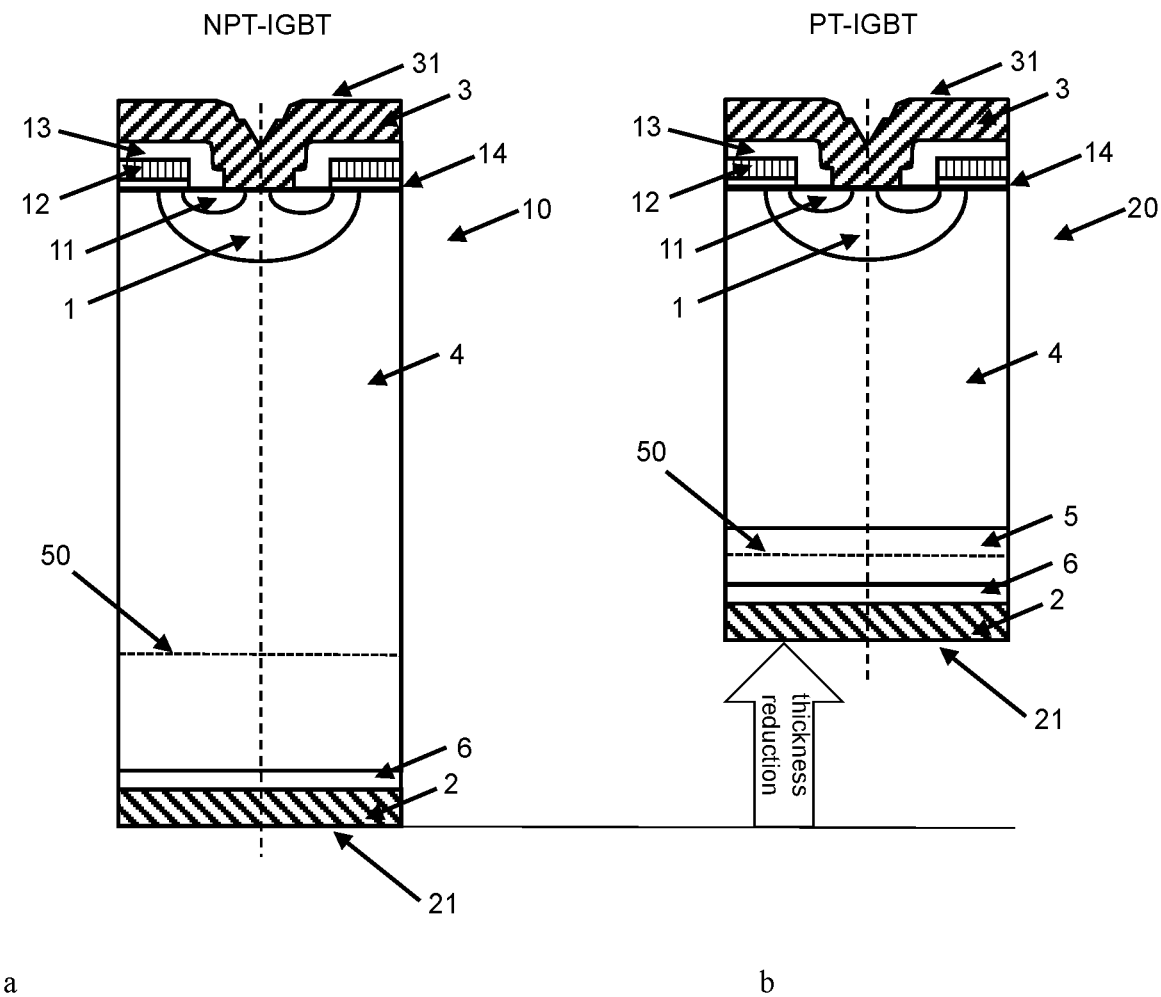
FIG. 1 shows the cross sections of prior art NPT-IGBT and PT-IGBT, while depicting the potential thickness reduction achieved with PT-IGBT compared to a NPT-IGBT.
Figure 5:
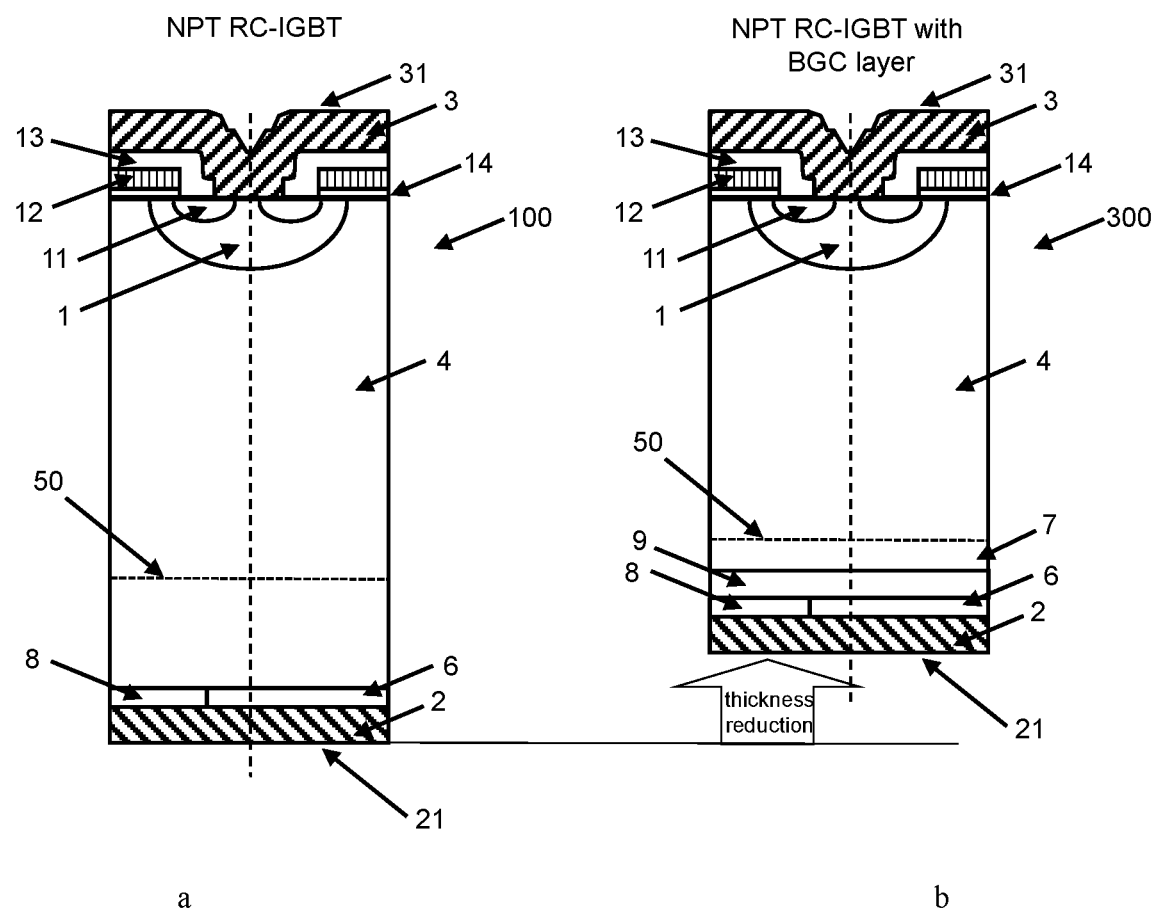
FIG. 5 shows the cross sections of both prior art NPT RC-IGBT and Thin NPT RC-IGBT according to an embodiment of the invention, while depicting the potential thickness reduction achieved with the new thin NPT RC-IGBT compared to a prior art NPT RC-IGBT.

FIG. 5, element b, shows a semiconductor device according to an embodiment of the invention. The standard non-punch-through semiconductor device is represented in FIG. 1, element a, as an NPT-IGBT 10. It comprises a three-layer structure having a collector side 21 and an emitter side 31 lying opposite to the collector side 21. The layers provided on the emitter side 31 typically comprise a p-type doped channel region 1 which surrounds an n-type doped source region 11. These regions 1, 11 are in electrical contact with an emitter electrode 3. A gate electrode 12 is manufactured on top of the wafer, electrically insulated from the layers 1, 11 by a gate insulation layer 14 for forming the channel and electrically insulated from the emitter electrode 3 by an insulating layer 13.

A base layer 4 is located between the emitter 3 and the collector 2.

On the collector side 21, a collector metallization 2 is formed in contact with collector layer 6 which is formed in the finalized semiconductor device 10 by implantation or deposition of p-type particles.

Figure 2:
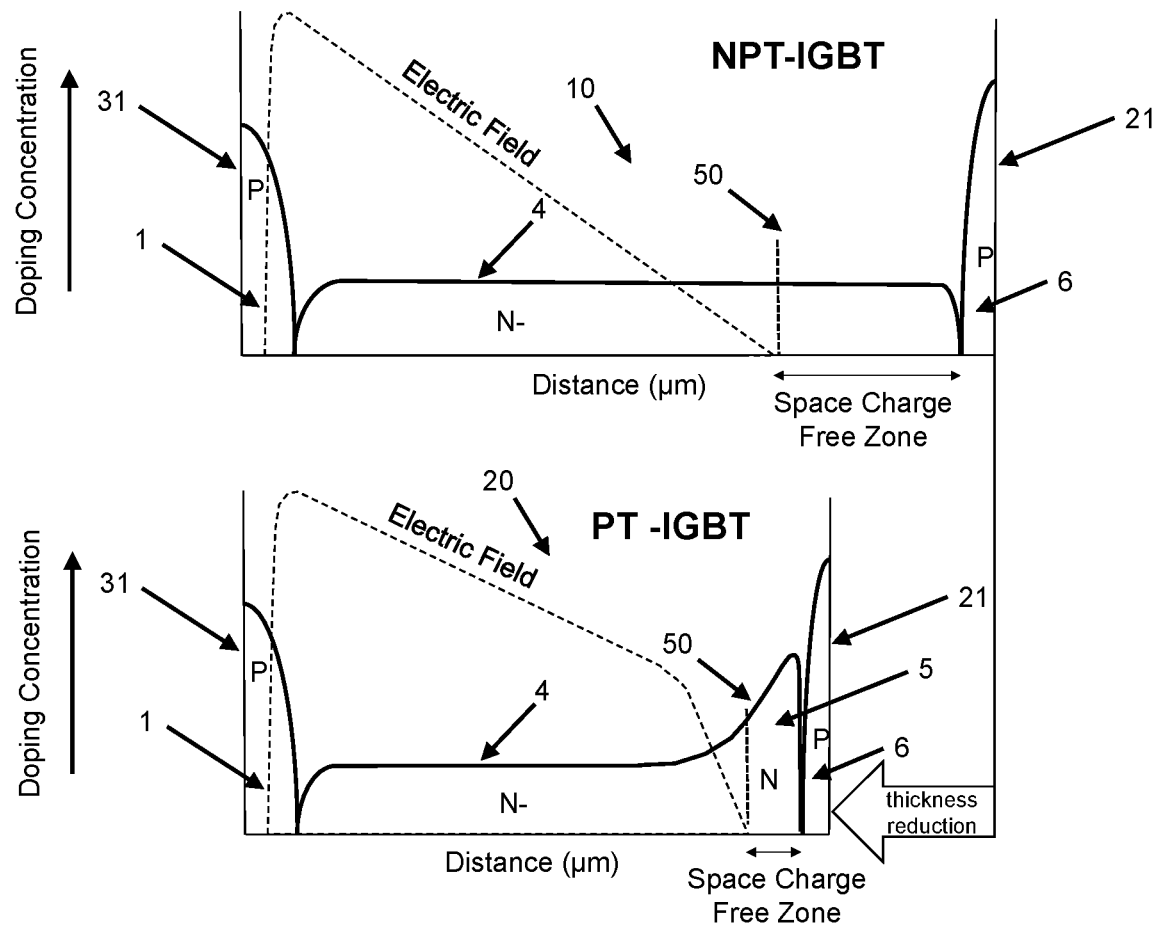
FIG. 2 shows a representation of the corresponding doping concentration profile and electrical field at $V_{bd}$ of prior art NPT-IGBT and PT-IGBT, while depicting the potential thickness reduction achieved with PT-IGBT compared to a NPT-IGBT.

The standard punch-through device is represented in FIG. 1, element b, as a PT-IGBT 20 which includes an additional n-type doped buffer layer or field stop 5. Due to the buffer layer 5, the thickness of the PT-IGBT is much reduced compared to the NPT-IGBT. FIG. 2 shows the corresponding doping concentration profile and electrical field at $V_{bd}$ for both NPT and PT devices. For the NPT-IGBT 10, the electric field (space charge region) edge 50 at $V_{bd}$ ensures a wide space charge free SCF zone (un-depleted zone) in the base region 4. For a PT-IGBT, the SCF zone is located in the buffer layer 5.

Figure 3:
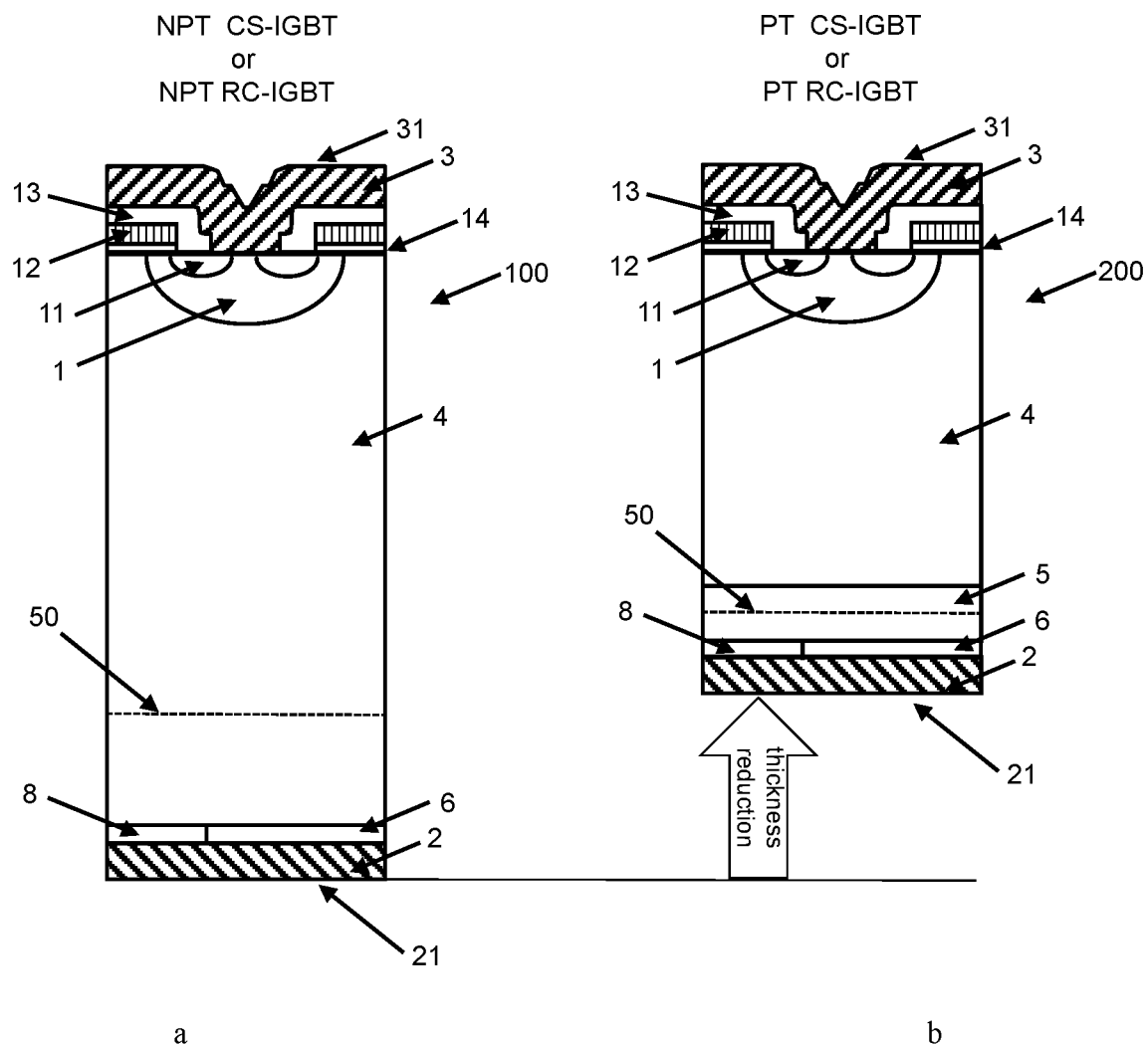
FIG. 3 shows the cross sections of prior art NPT CS-IGBT or NPT RC-IGBT and PT CS-IGBT or PT CS-IGBT, while depicting the potential thickness reduction achieved with PT device compared to a NPT device.
Figure 4:
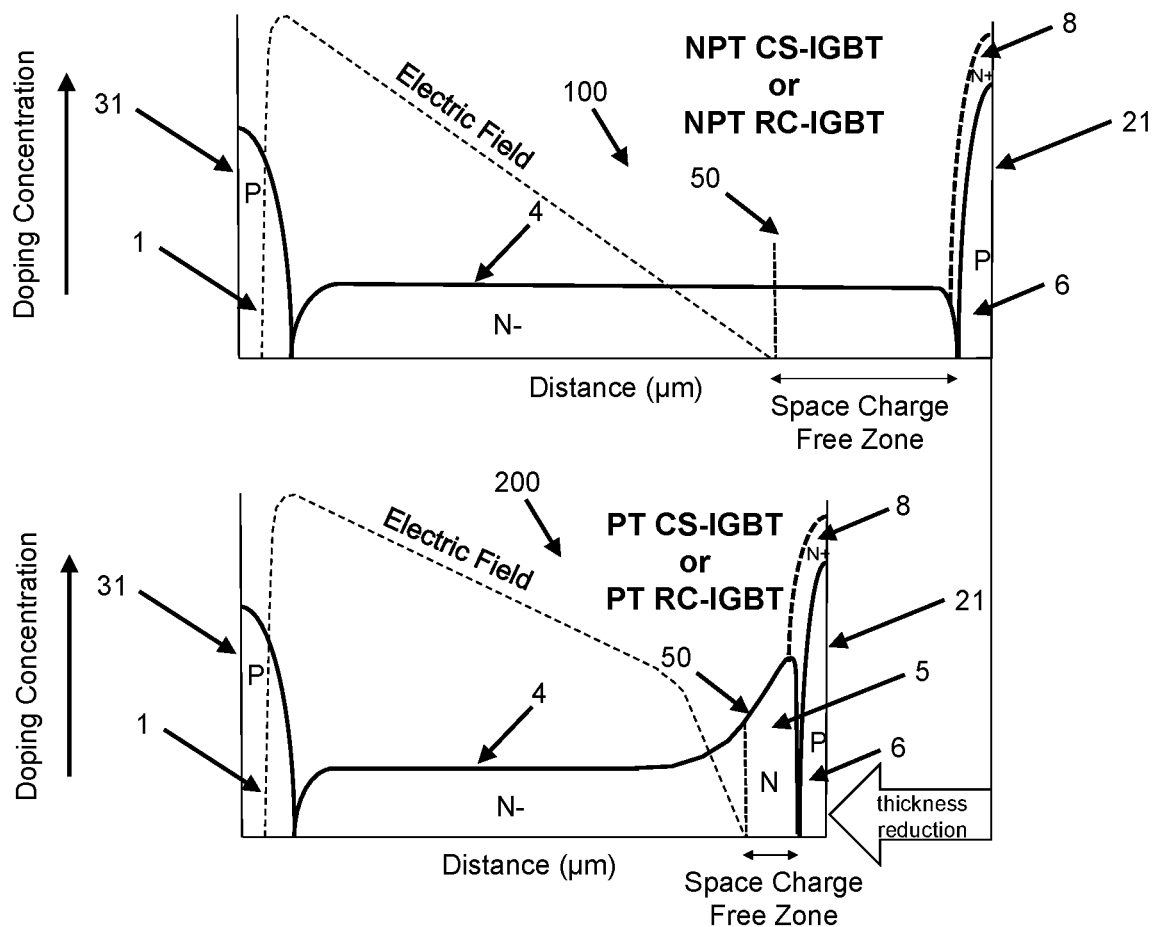
FIG. 4 shows a representation of the corresponding doping concentration profile and electrical field at $V_{bd}$ of prior art NPT CS-IGBT or NPT RC-IGBT and PT CS-IGBT or PT CS-IGBT, while depicting the potential thickness reduction achieved with the PT device compared to a NPT device.

To control the collector injection efficiency or integrate a freewheeling diode in the same IGBT device, a shorted collector CS design is employed for both NPT CS-IGBT 100 (or NPT RC-IGBT) 100 and PT CS-IGBT 200 (or PT RC-IGBT). FIG. 3 shows the cross section of both devices which includes an additional n-type doped short region 8. FIG. 4 shows the corresponding doping concentration profile and electrical field at $V_{bd}$ for both NPT And PT devices with collector shorts 8.

For both NPT and PT devices, the pnp bipolar gain $\beta_{pnp}$ can be calculated using $$\beta_{PNP} = \frac{n_{iSCF}^2}{n_{iC}^2} \cdot \frac{D_{pSCF}}{D_{nC}} \cdot \frac{L_{nC}}{W_{SCF}} \cdot \frac{N_{AC}}{N_{DSCF}}$$

Where $W_{SCF}$ is the width of the SCF zone, $N_{DSCF}$ and $N_{AC}$ represent the background doping of the SCF zone and the IGBT p-type collector 6 respectively. Also, $D_{pSCF}$ and $D_{nC}$ are the minority carrier diffusion coefficients in the SCF zone and collector 6 respectively. Finally, $L_{nC}$ is the diffusion length of electrons in the collector 6.

A narrower $W_{SCF}$, lower $N_{DSCF}$ and/or higher $N_{AC}$ values will result in increased gain levels having the drawback of increased leakage currents.

Therefore, due to the absence of a buffer layer 5, the NPT-IGBT 10 requires wide $W_{SCF}$ to enable 125° C. operating temperature capability albeit with increase losses. Furthermore, this presents a clear limit to reduce the NPT device thickness while operating at even higher temperatures.

Hence, the addition of a buffer layer 5 as for PT-IGBT 20 will result in lower leakage currents especially at higher temperatures. Furthermore, the addition of collector shorts 8 will also result in reduced injection efficiency and can contribute to a higher value for $N_{DSCF}$ for a reduced $\beta_{pnp}$.

In the past, the following equation was used to calculate the optimum thickness of a NPT-IGBT:

$$W_{NPT}(\mu m) = V_{rating}(V) \times (0.15 \text{ to } 0.166)\left(\frac{\mu m}{V}\right)$$

The device breakdown voltage can be calculated as follows $$V_{bd}(V) = \frac{\varepsilon_s E_c^2}{2qN_{DB}} = \frac{1.31 \times 10^{17}\left(\frac{V}{cm^3}\right)}{N_{DB}\left(\frac{1}{cm^3}\right)}$$

Where $\varepsilon_s$ is the permittivity of silicon and equal to $1.05 \times 10^{-12}$ F/cm, q is the electron charge and equal to $1.602 \times 10^{-19}$ C, $E_c$ is the critical electric field and assumed here to be $2 \times 10^5$ V/cm and $N_{DB}$ is the doping concentration of the base region 4.

The width of the space charge region $W_{scr}$ at $V_{bd}$ is given as $$W_{scr}(\mu m) = \frac{2V_{bd}}{E_c} = V_{bd}(V) \times 0.1\left(\frac{\mu m}{V}\right)$$

Hence, the space charge free (SCF) zone can be calculated as $$W_{SCF}(\mu m) = W_{NPT}(\mu m) - W_{scr}(\mu m) =$$
$$(0.15 \text{ to } 0.166)\left(\frac{\mu m}{V}\right) \times V_{rating}(V) - 0.1\left(\frac{\mu m}{V}\right) \times V_{bd}(V)$$

Figure 7:
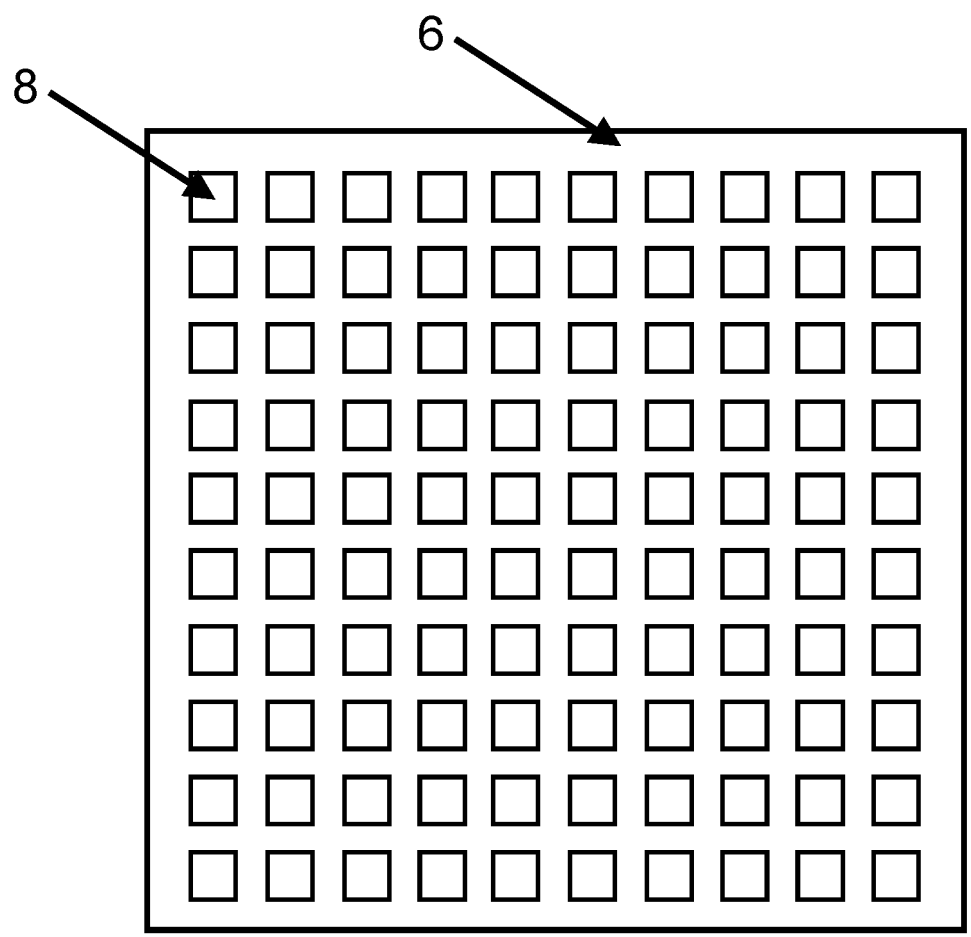
FIG. 7 shows a plan view of the structures of first and second regions of a reverse-conducting IGBT according to the invention.

FIG. 5, element b, schematically shows a typical cross section for a thin non-punch-through semiconductor device or thin NPT RC-IGBT 300 in accordance with an embodiment of the present invention. On the emitter side 31, the doping profile of the p-type layer 1 and of the adjacent n-type base layer 4 is similar to the case of a prior art non-punch-through or punch-through semiconductor device. However, as can be easily derived by comparing with FIG. 3a for a prior-art NPT RC-IGBT 100, the thickness of the base layer is significantly reduced. A predefined collector short pattern of alternate p-type doped 6 and n-type doped 8 regions are introduced on the collector side 21. FIGS. 7, 8 and 9 shows plan views of the different collector short patterns for the thin NPT RC-IGBT according to the invention. Typical designs for the collector short pattern are a cellular design (as shown in FIG. 7) or a stretched cellular design (as shown in FIG. 8), or a stripe design (as shown in FIG. 9).

Figure 6:
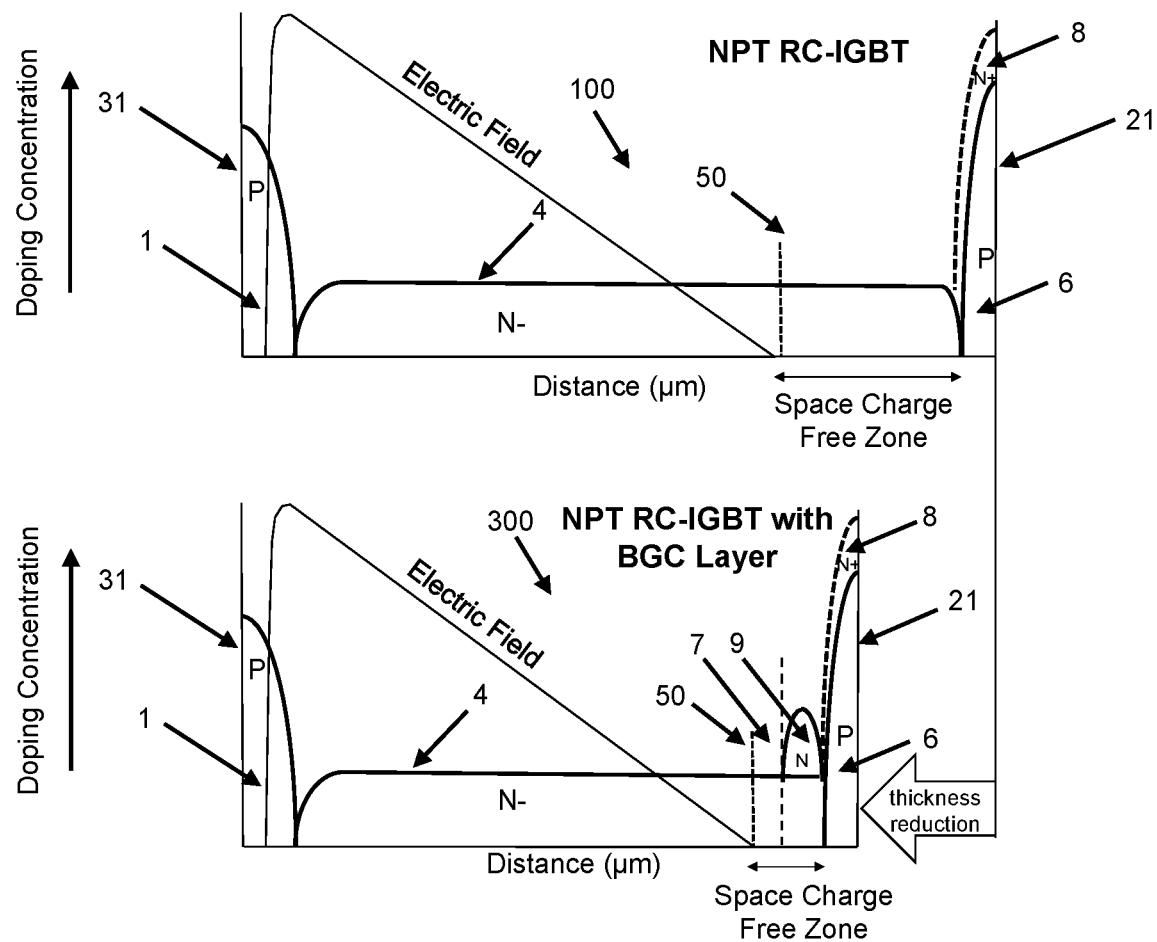
FIG. 6 show a representation of the corresponding doping concentration profile and electrical field at $V_{bd}$ of a prior art NPT RC-IGBT and a Thin NPT RC-IGBT according to an embodiment of the invention, while depicting the potential thickness reduction achieved with the new thin NPT RC-IGBT compared to a prior art NPT RC-IGBT.

Additionally, to increase $N_{DSCF}$ for obtaining a lower $W_{SCF}$ and therefore a lower pnp bipolar gain, an n-type low doped bipolar gain control BGC layer 9 may be implemented into the second side of the wafer 21. The BGC layer 9 is located in its entirety in the SCF zone close to the collector side 21. FIG. 6, element b, shows the location of the BGC layer 9 in the SCF zone. A distance 7 may separate the edge of the electric field 50 (space charge region) at $V_{bd}$ from the BGC layer 9.

The combination of the collector shorts 8 and BGC layer 9 allows substantial reductions in the pnp bipolar gain levels and hence a thinner NPT RC-IGBT design can be realized based on the following equation $$W_{NPT-RC}(\mu m) = V_{rating}(V) \times (0.125 \text{ to } 0.133)\left(\frac{\mu m}{V}\right)$$

Hence, the space charge free (SCF) zone 300 in accordance with an embodiment of the present invention can be given as $$W_{SCF}(\mu m) = W_{NPT-RC}(\mu m) - W_{scr}(\mu m) =$$
$$(0.125 \text{ to } 0.133)\left(\frac{\mu m}{V}\right) \times V_{rating}(V) - 0.1\left(\frac{\mu m}{V}\right) \times V_{bd}(V)$$

Based on the above equations, Table 1 was obtained showing both the prior-art NPT IGBT 10 and NPT RC-IGBT 100 designs for 600 V, 900 V, 1200 V, and 1700 V and a thin NPT RC-IGBT 300 in accordance with the present invention. The table includes the design parameters and relevant ratios while utilizing ($0.158 V_{rating}$) for calculating $W_{NPT}$ for prior art devices and ($0.129 V_{rating}$) for calculating $W_{NPT-RC}$ for the device in accordance with the present invention.

For example, while the thickness of the conventional NPT device rated at 1200V may be above 180 μm, the thickness of the new NPT device may be less than 160 μm.

TABLE 1

| | Prior Art NPT-IGBT and NPT RC-IGBT | | | | |
|---|---|---|---|---|---|
| $V_{rating}$ | V | 600 | 900 | 1200 | 1700 |
| $V_{bd\ (including\ 15\%\ margin)}$ | V | 690 | 1035 | 1380 | 1955 |
| $W_{NPT}$ | μm | 95 | 142 | 190 | 269 |
| $W_{SCR}$ | μm | 69 | 103.5 | 138 | 195.5 |
| $W_{SCF}$ | μm | 26 | 39 | 52 | 73 |
| $W_{SCF}/W_{NPT}$ | % | 27% | 27% | 27% | 27% |
| $N_{DB}$ | atom/cm³ | 1.90E+14 | 1.27E+14 | 9.49E+13 | 6.70E+13 |
| Base Resistivity | ohm · cm | 23 | 34 | 46 | 64 |
| Base Resistivity with 15% margin | ohm · cm | 26 | 39 | 53 | 74 |

TABLE 1-continued

| Thin NPT RC-IGBT in accordance with the new invention | | | | | |
|---|---|---|---|---|---|
| $V_{rating}$ | V | 600 | 900 | 1200 | 1700 |
| $V_{bd}$ | V | 690 | 1035 | 1380 | 1955 |
| $W_{NPT-RC}$ | μm | 77 | 116 | 155 | 219 |
| $W_{SCR}$ | μm | 69 | 103.5 | 138 | 195.5 |
| $W_{SCF}$ | μm | 8 | 13 | 17 | 24 |
| $W_{SCF}/W_{NPT-RC}$ | % | 11% | 11% | 11% | 11% |
| $N_{DB}$ | atom/cm$^3$ | 1.90E+14 | 1.27E+14 | 9.49E+13 | 6.70E+13 |
| Base Resistivity | ohm · cm | 23 | 34 | 46 | 64 |
| Base Resistivity with 15% margin | ohm · cm | 26 | 39 | 53 | 74 |

FIG. 10 shows a graph representing the blocking characteristics (collector leakage current $I_c$ versus the collector emitter voltage $V_{ce}$) at 125° C. for 1200V rated devices. The graph depicts the blocking characteristics of a conventional non-punch-through NPT IGBT 10 with a device thickness of (A) 185 μm, (B) 175 μm (C) 165 μm and (D) 155 μm, along with conventional NPT RC-IGBT 100 with a thickness of 185 μm (F). A conventional punch-through PT-IGBT 20 with a thickness of 130 μm (E) is also included for reference. The curves are compared to the blocking characteristic of a thin NPT RC IGBT 300 in accordance with the present invention, with a thickness of 155 μm (G) and a BGC layer doping concentration equal to $N_{BD}$. The conventional NPT-IGBT 10 shows clear limitations even for the 185 μm state-of-the-art design. Both conventional PT-IGBT 20 and NPT RC-IGBT 100 show low leakage levels with the thin NPT RC-IGBT 300 maintaining good performance up to 1200V even with the minimum BGCL doping level. The NPT RC-IGBT 300 has similar conduction voltage drop $V_{ce(sat)}$ at 100 A/cm$^2$ to the PT-IGBT 20 and 15% lower than the conventional thicker device 100. Furthermore, the NPT RC-IGBT 300 has 15% lower turn-off losses than the conventional thicker device 100.

FIG. 11 shows a graph representing the blocking characteristics (collector leakage current $I_c$ versus the collector emitter voltage $V_{ce}$) at 200° C. for 1200V rated devices. The graph depicts the blocking characteristic of a conventional punch-through IGBT 20 with a device thickness of (E) 130 μm. The curves include the thin NPT RC IGBT 300 in accordance with the present invention, with a thickness of 155 μm, having a 2 μm thick BGC layer with peak doping concentrations of (G) equal to $N_{BD}$, (H) $5 \times 10^{14}$ cm$^{-3}$, (I) $1 \times 10^{15}$ cm$^{-3}$, (J) $5 \times 10^{15}$ cm$^{-3}$, and (K) $1 \times 10^{16}$ cm$^{-3}$. It is clear that depending on the application requirements, the new design can be adjusted to match the target performance by adjusting the BGC layer doping concentration.

In order to produce a thin non-punch-through semiconductor device according to an exemplary embodiment of the present invention, an n-type wafer with a resistivity of for example 53 ohm·cm for a 1200V device (a base doping concentration of $8.15 \times 10^{13}$ cm$^{-3}$ may be provided as a substrate as shown in FIG. 12, element a. On a first side which, in the finalized semiconductor device forms the emitter side, one or more layers for forming an emitter structure may be produced for example by diffusion processes as shown in FIG. 12, element b. Then, the wafer which originally may have a thickness of for example more than 300 μm may be thinned on its second side to a predetermined thickness of for example 160 μm as shown in FIG. 12, element c. This may be done for example by grinding, and etching 40. For the specific case of producing an RC-IGBT, the collector or anode design 6 using a uniform implantation of p-type dopants 60 such as boron is performed as shown in FIG. 13, element a. Also, a thin p-type silicon layer may be deposited on the collector side of the wafer. Then, the n-type short 8 is performed using implantation of n-type dopants such as phosphorus 70 is through a predefined pattern on a mask as shown in FIG. 13, element b. The much higher dose of the phosphorus will ensure full compensation of the p-type collector in the short regions. The collector 6 and short 8 regions dopants are activated by low temperature annealing below 500° C. or laser annealing may be applied.

For the low doped n-type BGC layer 9, n-type particles such as phosphor or arsenic atoms may be implanted and activated with the collector 6 and short regions as shown in FIG. 13, element c. Alternatively, hydrogen atoms may be implanted followed by a low temperature annealing below 450° C.

Finally, the collector metallization 2 is performed to obtain the finished thin NPT RC-IGBT 300 device in accordance to the present invention as shown in FIG. 14.

The thin NPT RC-IGBT 300 according to the present invention design proposed herein may be applied to all types of IGBT cell designs including enhanced planar IGBTs 301 with an n-type doped enhancement layer 15 surrounding the p-type channel layer 1 as shown in FIG. 15 and trench IGBTs 302 as shown in FIG. 16, as well as enhanced trench IGBTs or other combinations of planar and trench cell designs.

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

The invention claimed is:

1. A non-punch-through reverse conducting semiconductor device which comprises a freewheeling diode and an insulated gate bipolar transistor with layers of a first and a second conductivity type, a first main side, and a second main side, wherein the first main side is arranged opposite of the second main side, having at least a four-layer structure comprising:
    an emitter electrode on the first main side, which lies opposite a collector electrode on the second main side, wherein the first main side is structured as a functional MOSFET type cell that has planar gate electrodes or trench-based gate electrodes,
    a base layer arranged between the first main side and the second main side, and
    a patterned collector layer on the second main side with alternating first and second conductivity type regions that form collector shorts, a bipolar gain control layer arranged between the base layer and the patterned collector layer, wherein the bipolar gain control layer has a same first conductivity type as the base layer and has a peak doping concentration below $1\times10^{16}$ cm$^{-3}$, and a thickness between 1 μm and 10 μm;

wherein, up to an avalanche breakdown voltage $V_{bd}$ of the semiconductor device:

the bipolar gain control layer is arranged entirely in a space charge free zone; and a thickness and a doping concentration of the base layer are adapted such that a thickness of the space charge free zone on the second main side is less than 15% of a total device thickness at the avalanche breakdown voltage $V_{bd}$;

wherein a thickness of the space charge free zone ($W_{SCF}$) is given by $$W_{SCF}(\mu m) = (0.125 \text{ to } 0.133)\left(\frac{\mu m}{V}\right)\times V_{rating}(V) - 0.1\left(\frac{\mu m}{V}\right)\times V_{bd}(V)$$

where $V_{rating}$ is a voltage rating of the non-punch-through reverse conducting semiconductor device and is one of 600 V, 900 V, 1200 V, or 1700 V.

2. The non-punch-through reverse conducting semiconductor device of claim 1, wherein the avalanche breakdown voltage $V_{bd}$ is defined as $$V_{bd}(V) = \frac{\varepsilon_s E_c^2}{2qN_{DB}} = \frac{1.31\times 10^{17}\left(\frac{V}{cm^3}\right)}{N_{DB}\left(\frac{1}{cm^3}\right)}$$

where $\varepsilon_s$ is a permittivity of silicon=$1.05\times10^{-12}$ F/cm, q is an electron charge=$1.602\times10^{-19}$ C, $E_c$ is the critical electric field and assumed to be $2\times10^5$ V/cm and $N_{DB}$ is the doping concentration of the base region.

3. The non-punch-through reverse conducting semiconductor device of claim 1, wherein a gain of the insulated gate bipolar transistor ($b_{PNP}$) is defined as $$\beta_{PNP} = \frac{n_{iSCF}^2}{n_{iC}^2}\cdot\frac{D_{pSCF}}{D_{nC}}\cdot\frac{L_{nC}}{W_{SCF}}\cdot\frac{N_{AC}}{N_{DSCF}}$$

where $W_{SCF}$ is the thickness of the space charge free zone, $N_{DSCF}$ and $D_{pSCF}$ represent a background doping concentration and a minority carrier diffusion coefficient in the space charge free (SCF) zone, $N_{AC}$, $D_{nC}$ and $L_{nC}$ represent a background doping concentration, a minority carrier diffusion coefficient and a diffusion length of electrons respectively in the collector's second conductive type region.

4. The non-punch-through reverse conducting semiconductor device of claim 1, wherein a peak doping concentration of the bipolar gain control layer is less than $1\times10^{15}$ cm$^{-3}$ and a thickness of the bipolar gain control layer is between 1 μm and 3 μm.

5. The non-punch-through reverse conducting semiconductor device of claim 1, wherein a doping concentration of the base layer and the thickness of the base layer are adapted such that the avalanche break down voltage of the semiconductor device is below 2500 V.

6. The non-punch-through reverse conducting semiconductor device of claim 1, wherein the semiconductor device has a voltage rating value less than 1800 V.

7. The non-punch-through reverse conducting semiconductor device of claim 1, wherein a width of the second conductivity regions of the patterned collector layer is greater than 50 um.

8. The non-punch-through reverse conducting semiconductor device of claim 7, wherein a width of the first conductivity regions of the patterned collector layer is greater than 10 um.

9. The non-punch-through reverse conducting semiconductor device of claim 8, wherein within the patterned collector layer, the width of the second conductivity regions is greater than or equal to the width of the first conductivity regions.

10. A system comprising one or more non-punch-through reverse conducting semiconductor devices of claim 1.

11. The system of claim 10 wherein the one or more non-punch-through reverse conducting semiconductor devices are thin non-punch-through reverse conducting Insulated Gate Bipolar Transistors.

* * * * *